United States Patent
Dunn (10) Patent No.: US 8,537,302 B2
(45) Date of Patent: Sep. 17, 2013

(54) LIQUID CRYSTAL DISPLAY ASSEMBLY COMPRISING AN LED BACKLIGHT ASSEMBLY AND A MOVABLE ELEMENT PLACED BEHIND THE LED BACKLIGHT ASSEMBLY HAVING A HINGE TO ALLOW ACCESS TO A REAR PORTION OF THE LED BACKLIGHT ASSEMBLY

(75) Inventor: William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 370 days.

(21) Appl. No.: 12/209,841

(22) Filed: Sep. 12, 2008

(65) Prior Publication Data

US 2009/0310065 A1    Dec. 17, 2009

Related U.S. Application Data

(60) Provisional application No. 61/060,504, filed on Jun. 11, 2008.

(51) Int. Cl.
*G02F 1/1335*    (2006.01)
*G02F 1/1333*    (2006.01)
*F21V 7/04*    (2006.01)

(52) U.S. Cl.
USPC ............... 349/61; 349/58; 362/631; 362/632

(58) Field of Classification Search
USPC ................. 349/50, 56, 57, 61, 62, 73, 74, 84; 362/97.3, 612, 630, 631, 249.02, 632–634
See application file for complete search history.

(56) References Cited

U.S. PATENT DOCUMENTS

| 7,052,152 | B2 | 5/2006 | Harbers et al. | |
|---|---|---|---|---|
| 7,481,553 | B2 | 1/2009 | Kim et al. | |
| 2004/0257492 | A1* | 12/2004 | Mai et al. | 349/61 |
| 2005/0162737 | A1* | 7/2005 | Whitehead et al. | 359/454 |
| 2006/0197474 | A1* | 9/2006 | Olsen | 315/312 |
| 2006/0215421 | A1* | 9/2006 | Chang et al. | 362/632 |
| 2006/0279946 | A1* | 12/2006 | Park et al. | 362/97 |
| 2006/0289201 | A1* | 12/2006 | Kim et al. | 174/261 |
| 2007/0019419 | A1* | 1/2007 | Hafuka et al. | 362/373 |
| 2007/0153515 | A1 | 7/2007 | Hong et al. | |
| 2007/0217221 | A1* | 9/2007 | Lee et al. | 362/612 |
| 2008/0036940 | A1 | 2/2008 | Song et al. | |
| 2008/0231196 | A1* | 9/2008 | Weng et al. | 315/90 |

FOREIGN PATENT DOCUMENTS

| JP | 11095214 | 4/1999 |
|---|---|---|
| JP | 2006145890 | 6/2006 |
| JP | 2007087662 | 4/2007 |
| JP | 200803481 | 2/2008 |
| KR | 1020080000144 | 1/2008 |
| KR | 1020080013592 | 2/2008 |
| KR | 1020080086245 | 9/2008 |

* cited by examiner

*Primary Examiner* — Paul Lee
(74) *Attorney, Agent, or Firm* — Standley Law Group LLP (57) ABSTRACT

Exemplary embodiments include a backlight assembly for an electronic display wherein said backlight assembly is comprised of a plurality of tiles. Each tile has a plurality of lights attached to it, such that when a single light or group of lights fail, the tile may be replaced without having to replace the entire backlight assembly. The lights in the assembly may be any one of the following: light emitting diodes (LED), organic light emitting diodes (OLED), field emitting display (FED), light emitting polymer (LEP), and organic electroluminescence (OEL). Embodiments also allow tiles to be removed from the rear of the display and dissipate heat from the lights to the rear of the backlight assembly.

5 Claims, 7 Drawing Sheets

Figure 1

LIQUID CRYSTAL DISPLAY ASSEMBLY COMPRISING AN LED BACKLIGHT ASSEMBLY AND A MOVABLE ELEMENT PLACED BEHIND THE LED BACKLIGHT ASSEMBLY HAVING A HINGE TO ALLOW ACCESS TO A REAR PORTION OF THE LED BACKLIGHT ASSEMBLY

CROSS-REFERENCE TO RELATED APPLICATIONS

This non-provisional patent application makes a claim of priority to co-pending application No. 61/060,504 filed Jun. 11, 2008 and is herein incorporated by reference in its entirety.

TECHNICAL FIELD

The various embodiments relate generally to backlight systems for electronic displays and more specifically to backlight systems for Liquid Crystal Displays (LCDs). Exemplary backlights may be comprised of removable tiles of lights and may dissipate thermal energy away from the lights.

BACKGROUND OF THE ART

Electronic displays and more specifically liquid crystal displays typically require some type of light source in order to generate an image upon a viewable screen. Specifically for liquid crystal displays (LCD's), a light source is required to shine through the crystals, where the crystals control the amount of light which will pass through by orienting themselves in response to a potential difference. This light source is typically referred to as the Back Light Unit (BLU), as this light source is placed behind the crystals and towards the back of the display assembly.

Previously, an arrangement of fluorescent lights has been used to construct the BLU for LCDs. Energy, environmental, relative size, life span, and various other concerns have prompted the electronic display industry to seek different lighting structures to produce the backlight for displays. A BLU for an LCD display which is comprised of various arrays of LEDs is disclosed in U.S. Pat. No. 7,052,152 and is herein incorporated by reference in its entirety.

For illustrative purposes, LED backlights may be discussed, but the embodiments may be practiced with any one of the following: LEDs, organic light emitting diodes (OLED), field emitting display (FED), light emitting polymer (LEP), and organic electro-luminescence (OEL).

LEDs have a limited life span, and eventually their luminance will degrade until little or no luminance is generated. Some LEDs may quickly fail simply due to a manufacturing defect. Currently when this occurs in an LED backlight, the entire BLU assembly is replaced (i.e. the element which every LED is mounted to is replaced with a new element containing all new LEDs). This is expensive, and is an unnecessary waste of the good LEDs which remain in the backlight. Alternatively, the LED backlight assembly could be removed from the display housing, and the degraded or faulty LEDs could be manually replaced. This is typically even more costly, and involves extensive manual labor. In currently known units, this also requires virtual complete disassembly of the LCD to gain access to the BLU. This complete disassembly is not only labor intensive, but must be performed in a clean room environment and involves the handling of relatively expensive, delicate, and fragile components that can be easily danger or destroyed, even with the use of expensive specialized tools, equipment, fixtures, and facilities.

These problems are intensified as the modern electronic displays, and more specifically LCDs grow larger and larger. For large displays, replacing the entire LED backlight assembly could be extremely expensive and could waste a large number of LEDs which still work properly, as well as damage or destroy the fragile LCD itself.

SUMMARY OF THE EXEMPLARY EMBODIMENTS

Exemplary embodiments comprise a backlight assembly which is constructed of multiple tiles of lights, such that a single tile may be replaced without having to replace the entire backlight assembly. Embodiments may be practiced with any number of electronic displays, where exemplary embodiments are practiced with LCD displays. Furthermore, the tiles in an exemplary embodiment may be replaced individually from the rear of the display without touching or disturbing the LCD or other delicate optical components. Furthermore, the BLU tile itself, may be constructed utilizing metal Printed Circuit Board (PCB) technology, where a metal surface forms the rear, thermally conductive surface of both the BLU and the LCD. The lights in the assembly may be any one of the following: LEDs, organic light emitting diodes (OLED), field emitting display (FED), light emitting polymer (LEP), and organic electro-luminescence (OEL).

BRIEF DESCRIPTION OF THE DRAWINGS

A better understanding of the exemplary embodiments of the invention will be had when reference is made to the accompanying drawings, wherein identical parts are identified with identical reference numerals, and wherein.

DETAILED DESCRIPTION OF A PREFERRED EMBODIMENT

Figure 1:
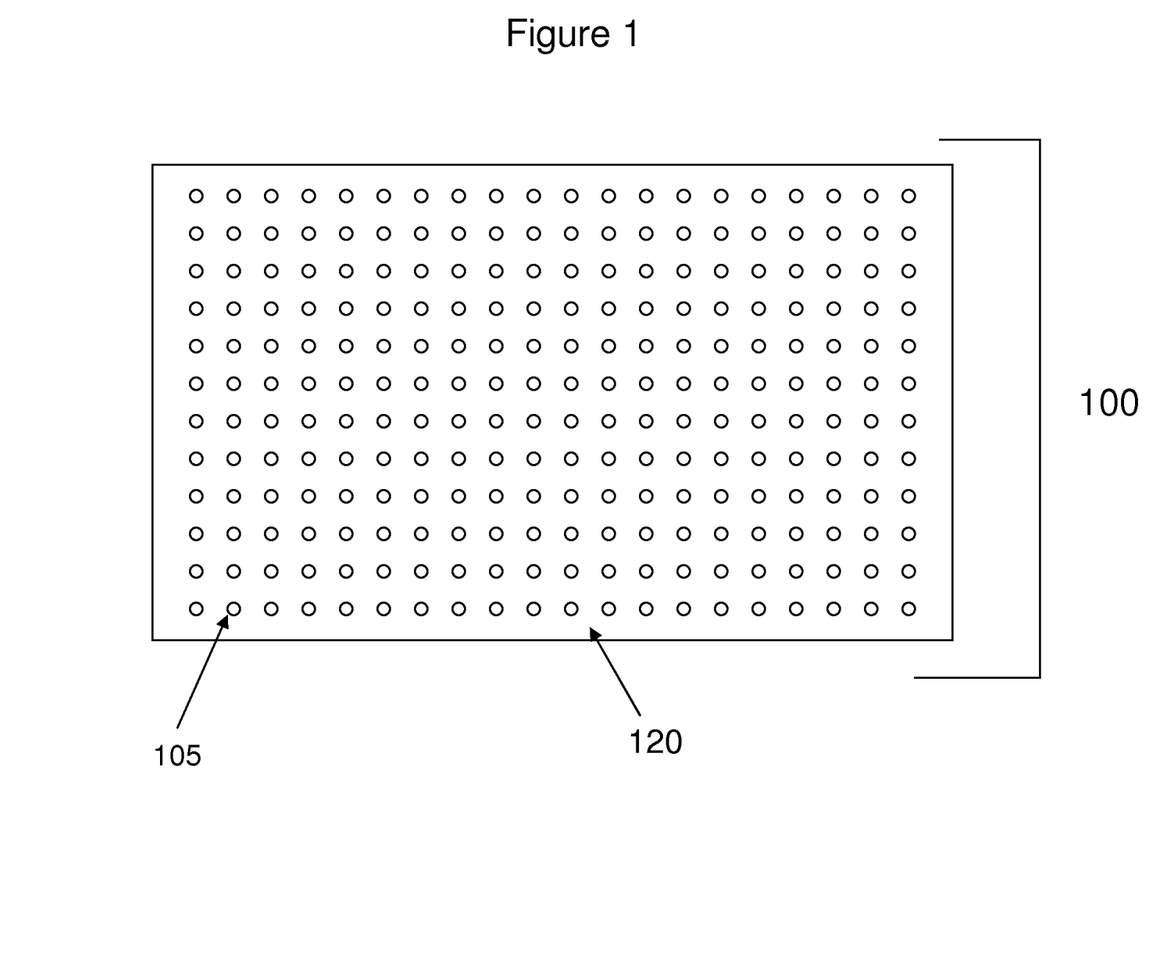
FIG. 1 is a front view of a traditional LED backlight.

Turning to the drawings for a better understanding, FIG. 1 shows the front view of a traditional backlight 100 using LED lights 105. These lights are typically mounted on some type of printed circuit board 120.

Figure 2:
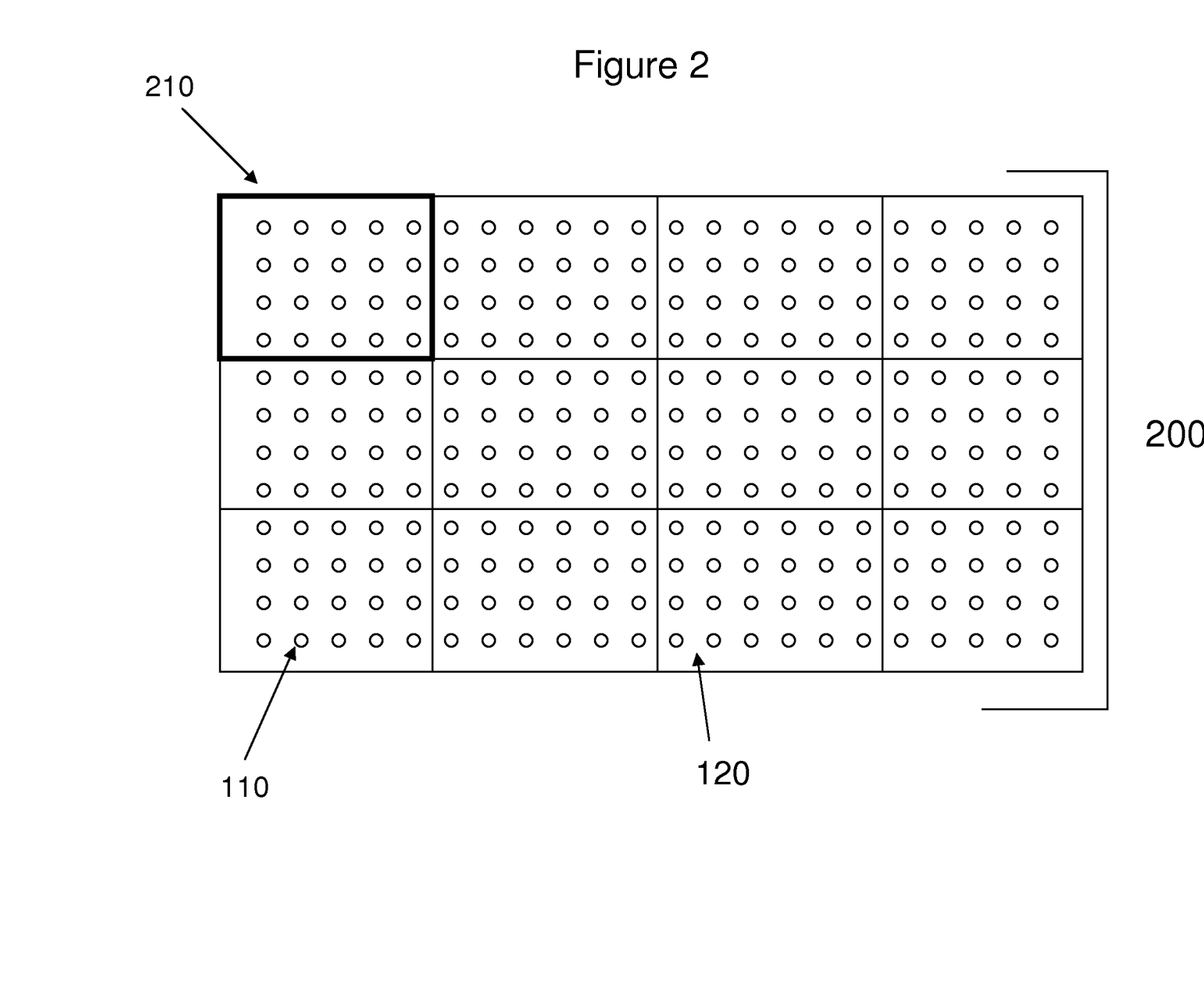
FIG. 2 is a front view of an exemplary embodiment.

FIG. 2 shows the front view of an exemplary embodiment where the backlight assembly 200 is divided into multiple tiles 210 with a number of lights 110 on each tile. These lights may be any one of the following: LEDs, organic light emitting diodes (OLED), field emitting display (FED), light emitting polymer (LEP), and organic electro-luminescence (OEL). A mounting element 120 provides the structure for which to mount the various lights 110. This mounting element 120 may be any solid structure which provides adequate securing of the lights 110, distributes power to and controls the lights 110, and may have additional layers and features which reflect light and have thermal properties. A printed circuit board could be used for this purpose or it may be one component in an assembly which would comprise the mounting element 120.

In an exemplary embodiment, the mounting element 120 may utilize metal PCB technology to dissipate heat from the lights 110 to the rear surface of the mounting element 120. In this exemplary embodiment, the rear surface of the mounting element 120 may be exposed metal, so that cool air may pass over this rear surface and further dissipate heat from the mounting element 120 and thus from the lights 110. In this exemplary embodiment, there should be a low level of thermal resistance between the chip or die which contains the lights 110 and the exposed rear metal surface of the mounting element 120.

Figure 3:
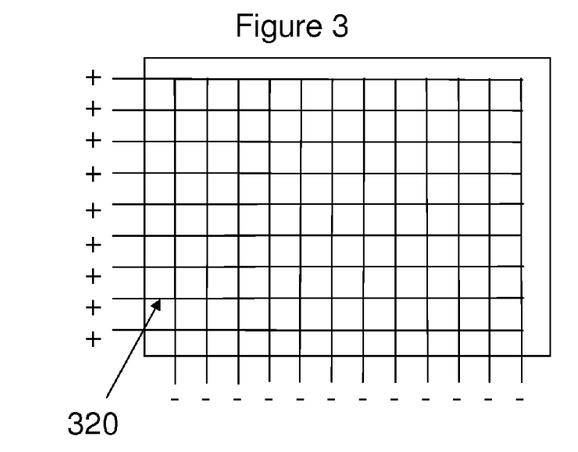
FIG. 3 is a rear view of an exemplary embodiment for powering and controlling the lights within a tile.

FIG. 3 shows the rear view of one embodiment for electrically distributing power to and controlling the lights within a single tile. In this embodiment, a grid of electrically conductive elements 320 is mapped out across the mounting element. This grid may or may not be visible when looking at the rear of the tile, as it may be covered by several other layers of the mounting element. These electrically conductive elements may be a layer of a printed circuit board or simply one layer for a multi-layer mounting element. Note that there are many ways to power and control the array of lights. Specifically, U.S. Pat. No. 7,052,152 which was incorporated above by reference, discloses several other ways to power and control LED lights. The lights could also be powered by using the parallel/series technique taught in co-pending application No. 61/061,032, herein incorporated by reference in its entirety.

Figure 4A:
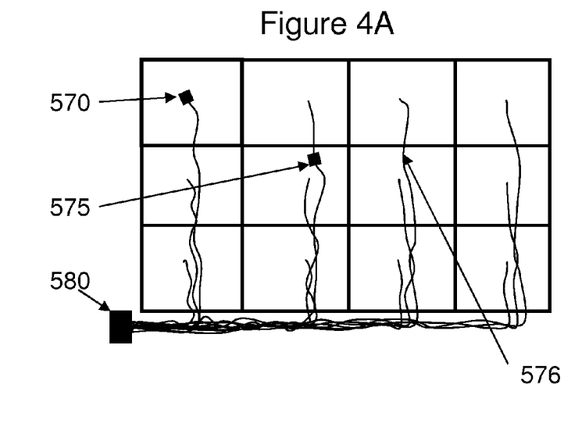
FIG. 4A is a rear view of one embodiment for electrically connecting and controlling each of the tiles within an exemplary backlight.

FIG. 4A shows a rear view of one embodiment for electrically connecting and controlling each of the tiles within an exemplary backlight. The electrically conductive elements 320 may be combined into a single plug 570 so that the tile may be easily connected/disconnected from the assembly. Many other methods can be used to connect the tiles. A wiring harness 575 could be placed further away from the tile itself or could be placed near a control box 580. Alternatively, the tile could be hard wired 576 with a wiring harness that plugs into the control box 580. To electrically disconnect a selected tile, the plug or wire harness is simply disconnected. The opposite would apply to connect a new tile. Note that any number of electrical connectors could be used and still fall within the teaching of this invention. Those skilled in the art can choose the precise type of connectors for the specific application and type of display.

The control box 580 may contain multiple elements which monitor and control the power which is sent to each tile. The control box 580 may even contain software to determine when a tile needs replaced.

Figure 4B:
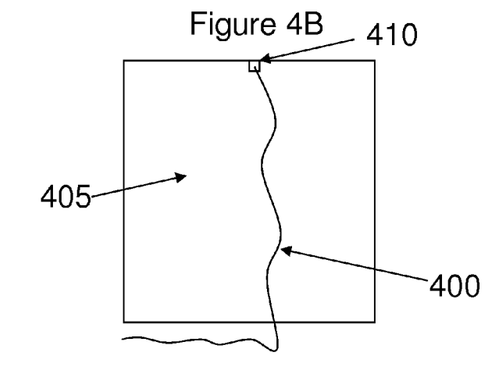
FIG. 4B is a rear view of another embodiment for electrically connecting a tile.
Figure 4C:
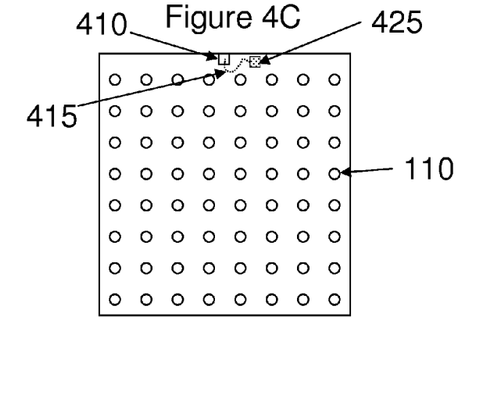
FIG. 4C is a front view of the embodiment for connecting a tile from FIG. 4B.

FIG. 4B shows another embodiment for electrically connecting a tile. In this embodiment, the wiring 400 passes through the tile 405 by traversing through the space 410. In an exemplary embodiment, the space 410 is as small as possible, so that light cannot leak into the rear of the display. FIG. 4C shows the front of the embodiment from FIG. 4B. Wiring 415 passes through the space 410 and connects to the plug 425. In an exemplary embodiment where the lights are producing white light, the wiring 415 and the plug 425 may be colored white so that any reflection of light off the surfaces of the wiring 415 or the plug 425 will not color the light coming from the lights 110. Again, any number of electrical connectors or wiring harnesses can be used to connect each tile. Connections on the front or rear of each tile may be beneficial depending on the manufacturing process, structure of the mounting element, and application of the display.

Figure 5A:
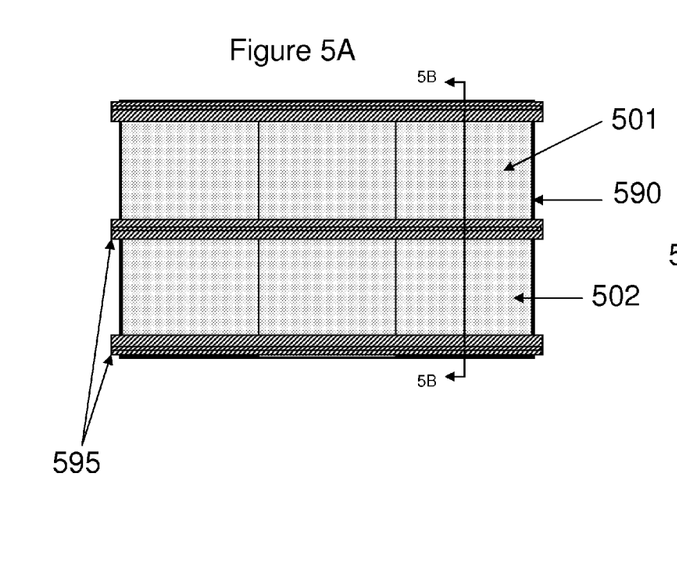
FIG. 5A is a rear view of an exemplary embodiment for securing multiple tiles and allowing access from the rear of the display.

FIG. 5A shows a rear view of one embodiment for removably securing the tiles into the backlight assembly. In this embodiment, each tile fits within a mounting structure 590. To secure the tile within the mounting structure 590, securing elements 595 may be used. The securing elements could be attached to the mounting structure 590 and/or the tiles 501 and 502, with any variety of removable fasteners. The securing elements could also snap into the mounting structure 590 or the tiles 501 and 502. In another embodiment, the tiles 501 and 502 may snap directly into the mounting structure 590.

Figure 5B:
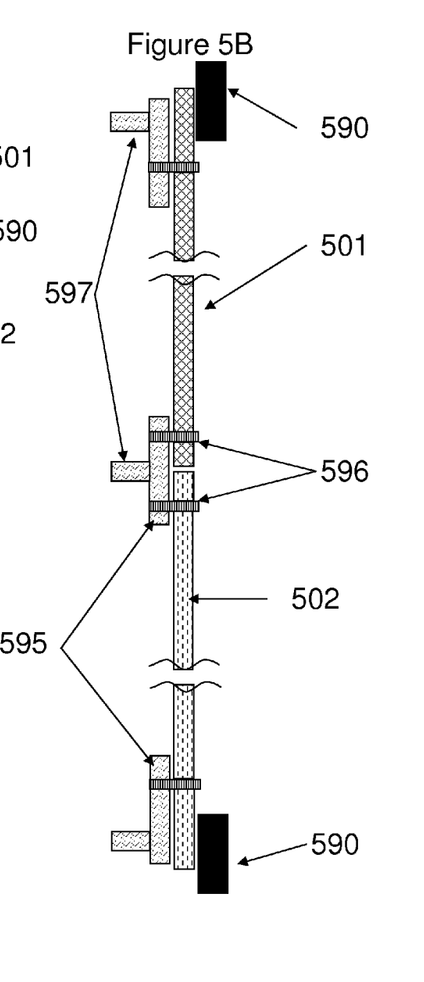
FIG. 5B is a cross-sectional view of the exemplary embodiment in FIG. 5A.

FIG. 5B is a cross-sectional view of the exemplary embodiment in FIG. 5A. Tiles 501 and 502 are secured between securing elements 595 and mounting structure 590. The securing elements 595 may contain stiffening ribs 597. Removable fasteners 596 may extend from the securing elements 595 to engage and fix tiles 501 and 502 in place. By removing the removable fasteners 596 and the securing elements 595, tiles can be removed from the rear of the display.

Figure 5C:
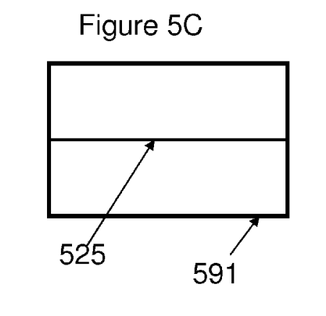
FIG. 5C is a rear view of another embodiment for securing multiple tiles and allowing access from the rear of the display.
Figure 5D:
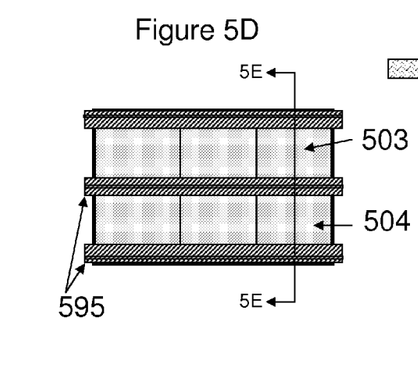
FIG. 5D is a rear view of the embodiment from FIG. 5C with tiles installed.
Figure 5E:
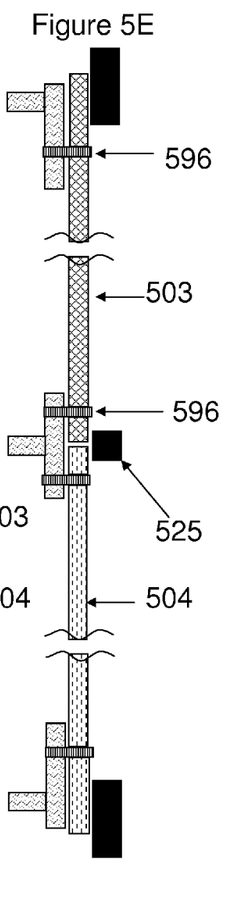
FIG. 5E is a cross-sectional view of the embodiment shown in FIG. 5D.

FIG. 5C shows another embodiment for securing multiple tiles and allowing access from the rear of the display that is similar to FIGS. 5A and 5B, except an additional supporting rib 525 has been added to the mounting structure 591. FIG. 5D shows the embodiment from FIG. 5C with tiles installed and supported by securing elements 595. FIG. 5E shows a cross-section of this same embodiment. The additional supporting rib 525 further secures the tiles 503 and 504. Note that removable fasteners 596 could also fasten to the mounting structure 591 and/or the additional supporting rib 525.

Figure 5F:
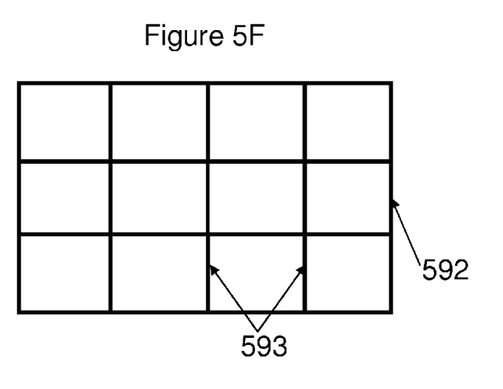
FIG. 5F is a rear view of another embodiment for securing multiple tiles and allowing access from the rear of the display.
Figure 5G:
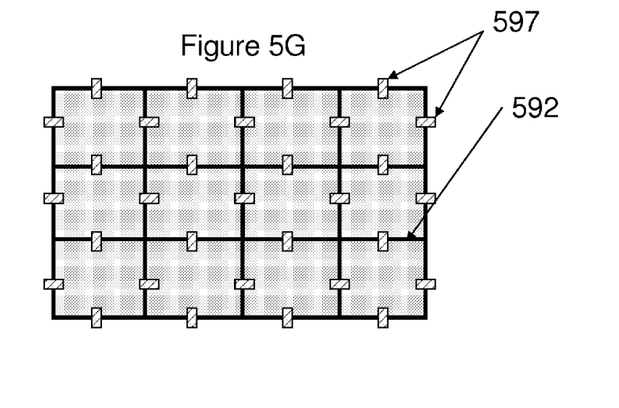
FIG. 5G is a rear view of the embodiment from FIG. 5F with tiles installed.

FIG. 5F shows another embodiment for securing multiple tiles and allowing access from the rear of the display. In this embodiment, the mounting structure 592 comprises additional vertical supporting ribs 593. Using this embodiment, the mounting structure may comprise a framework, similar to a 'tick-tack-toe' game setup. FIG. 5G shows the embodiment from FIG. 5F with tiles installed. To secure the tiles within the mounting structure 592, securing elements 597 are used. The securing elements could be attached to the mounting structure 592 and/or the tiles with any variety of removable fasteners. The securing elements 597 and/or the tiles could also snap directly into the mounting structure 592. Tiles may fit entirely within the mounting structure 592 or may overlap the mounting structure 592 and/or overlap adjacent tiles.

Figure 6:
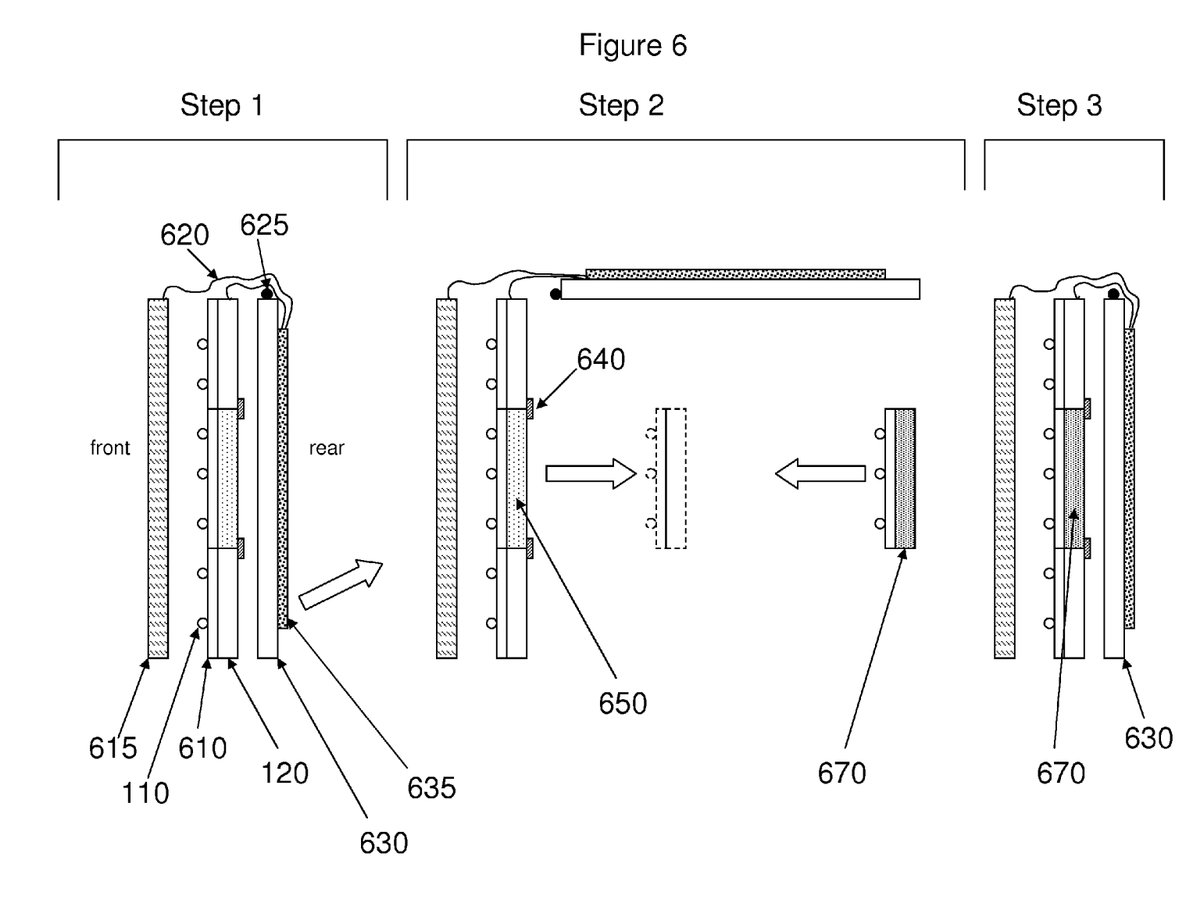
FIG. 6 is a side view illustration of one embodiment for accessing the tiles from the rear of the display.

FIG. 6 shows one embodiment for accessing the tiles from the rear of the display. For illustrative purposes, the basic components for an LCD display are shown, although the invention could be practiced for multiple types of displays. The elements of the display have been simplified, as the particulars of these elements are not critical to the invention.

Step 1 shows the basic layout of an LCD display. The image assembly 615 comprises the liquid crystal material which is sandwiched in between plates of glass and/or conductive material. Some of the plates surround the liquid crystal material, while others may be added in order to scatter/diffuse light, polarize light, color light, absorb light, or protect the display. These plates may be glass, plastic, or a composite material. Other sub-assemblies may be present within the image assembly 615 to control the individual cells of liquid crystal material or conduct other necessary processes for generating an image.

The lights 110 are attached to the mounting element 120. Preferably, the front surface of the mounting element 120 contains a reflective element 610 to reflect light towards the image assembly 615. As noted above, the mounting element 120 may contain many other layers for enhanced thermal, electrical, and mechanical properties. Various electronic devices 635 are at the rear of the display. These electronic devices 635 may be any one of the following: fans, motors, circuit boards, microprocessors, wiring, resistors, capacitors, power supplies, transformers, and connectors. These electronic devices 635 may be mounted on a movable element 630 which may be attached to a hinge 625. The electronic devices 635 electrically control the image assembly 615 and the lights 110 through wiring 620.

In step 2, the movable element 630 may rotate around the hinge 625 so that the faulty tile 650 can be accessed. The securing means 640 may be removed, as well as the electrical connections for tile 650, and the tile 650 is removed from the rear of the display. New tile 670 is then inserted into the backlight assembly, secured, and electrically connected. In step 3, the movable element 630 can be rotated back into its initial position from step 1.

Figures 7A, 7B:
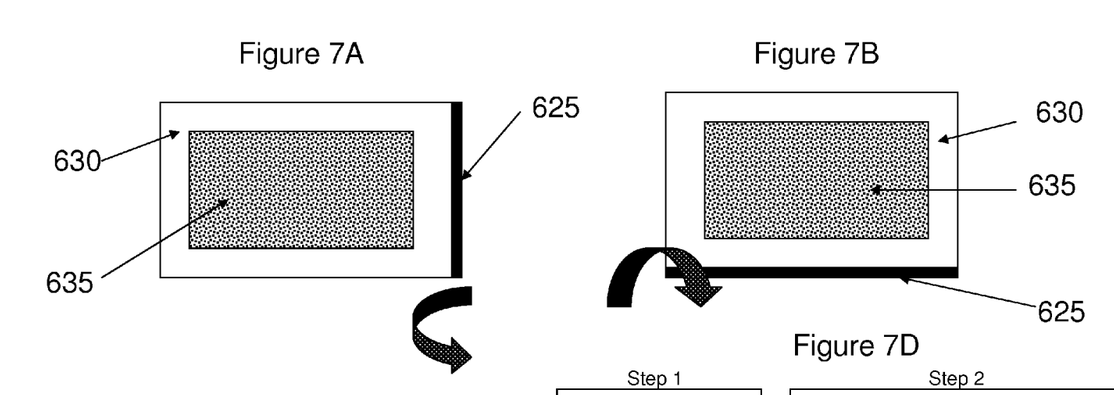
FIG. 7A-7C are rear views of further embodiments for accessing the tiles from the rear of the display.
Figure 7C:
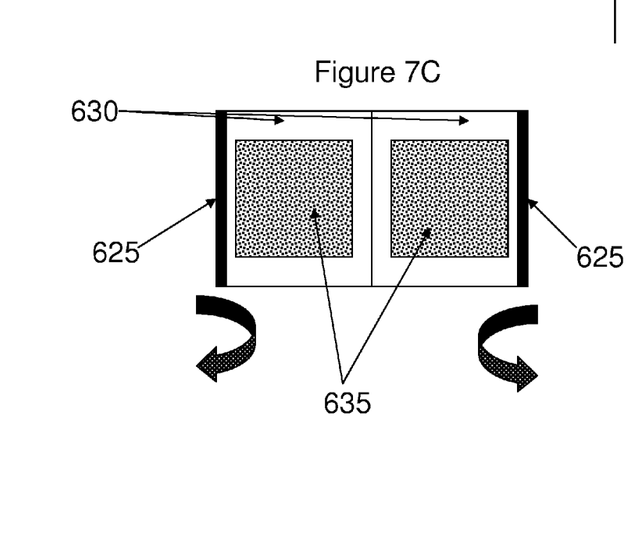
Figure 7D:
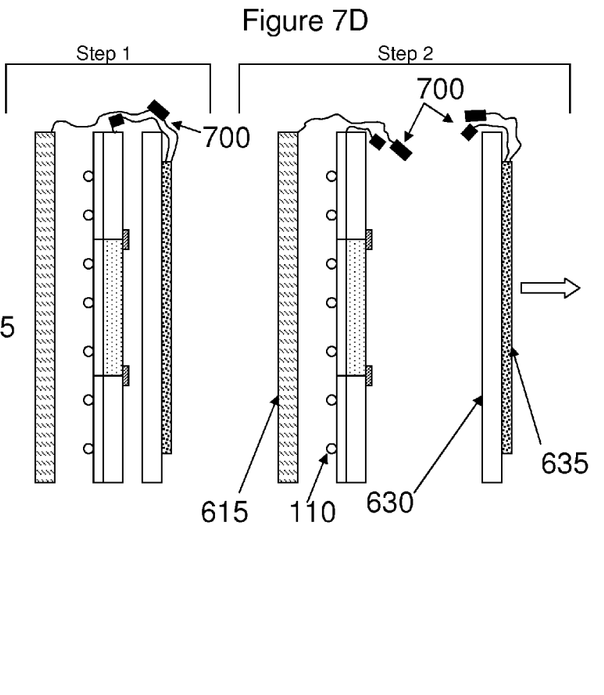
FIG. 7D is a side view illustration for another embodiment for accessing the tiles from the rear of the display.

The embodiment shown in FIG. 6 is only one way to allow access to the tiles through the rear of the display. FIGS. 7A through 7D show further embodiments. In FIG. 7A, the hinge 625 can be located on the right side of the movable element 630 so that the movable element 630 would open like a standard door. Obviously, another embodiment would place the hinge 625 on the left side of the movable element 630. In FIG. 7B, the hinge 625 is located along the bottom edge of the movable element 630. In FIG. 7C, the movable element 635 could be split into two parts with two hinges 625, one on each side. In FIG. 7D, the electrical devices 635 are connected to the image assembly 615 and the lights 110 by connectors 700. In Step 1, the connectors 700 are disconnected. In Step 2, the movable element 630 may simply be removed from the display housing so that the tiles can be accessed. It should be noted, that these are only a few embodiments which would allow access to the tiles through the rear of the display. Any method for allowing access from the rear of the display and without requiring the disassembly of the delicate/fragile LCD and/or optical films would fall within the scope of this invention. One skilled in the art could accomplish this task in a number of ways, using a combination of various doors or panels and a variety of different types and styles of electrical and mechanical connections.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. A liquid crystal display (LCD) assembly comprising:
an LED backlight assembly comprising
    a mounting structure having front and rear portions,
    a plurality of printed circuit boards (PCBs) having opposing front and rear surfaces and a perimeter edge portion, the PCBs being removably attached to said mounting structure, such that the PCBs can be removed from the rear portion of the mounting structure,
    a securing element which fastens each PCB within the mounting structure, the securing element is accessible from the rear portion of the mounting structure,
    a plurality of LEDs attached to each of the PCBs,
    conduction lines on the PCBs which establish electrical communications with each LED,
    an electrical connection on the front surface of each PCB which is in electrical communication with the conduction lines, and
    a flexible electrical conductor removably attached to and in electrical communication with each of the electrical connections;
an image assembly placed in front of the LED backlight assembly;
a movable element placed behind the LED backlight assembly and having at least one edge;
a hinge at one edge of the movable element so that the movable element can rotate to allow access to the rear portion of the LED backlight assembly; and
electrical devices attached to the movable element such that rotation of the movable element causes the electrical devices to move accordingly, where the electrical devices are also in electrical communication with the image assembly.

2. The LCD of claim 1, further comprising:
a metallic surface covering at least half of the rear surface of each PCB.

3. The LCD of claim 1 further comprising:
a space within each PCB which allows the flexible electrical conductor to pass through the PCB and connect with the electrical connection on the front surface of the PCB.

4. The LCD of claim 1 wherein:
the electrical devices comprise a power supply.

5. The LCD of claim 1 wherein:
the electrical devices comprise a microprocessor.

\* \* \* \* \*